United States Patent [19]

Kato et al.

[11] 4,454,500
[45] Jun. 12, 1984

[54] ANALOG DATA ACQUISITION DEVICE

[75] Inventors: Kazuo Kato, Ibaraki; Nobuaki Miyakawa; Makoto Aihara, both of Hitachi; Kiyoshi Matsubara, Kodaira, all of Japan

[73] Assignee: Hitachi, Ltd., Tokyo, Japan

[21] Appl. No.: 348,666

[22] Filed: Feb. 16, 1982

Related U.S. Application Data

[63] Continuation-in-part of Ser. No. 114,390, Jan. 22, 1980, abandoned.

[30] Foreign Application Priority Data

Jan. 26, 1979 [JP] Japan .................................... 54-7911

[51] Int. Cl.$^3$ ........................................... H03K 13/02
[52] U.S. Cl. ......................... 340/347 AD; 340/347 C; 340/347 DA
[58] Field of Search .... 340/347 C, 347 AD, 347 DA; 364/200, 900

[56] References Cited

U.S. PATENT DOCUMENTS 4,112,427 9/1978 Höfer ............................. 340/347 C

OTHER PUBLICATIONS

Schoeff, "IEEE Journal of Solid-State Circuits", vol. SC-13, No. 6, Dec. 1978, pp. 746-753.
Walton, "IBM Technical Disclosure Bulletin", vol. 7, No. 10, Mar. 1965, pp. 881-885.

Primary Examiner—C. D. Miller
Attorney, Agent, or Firm—Antonelli, Terry & Wands

[57] ABSTRACT

An analog data acquisition device fetches a plurality of analog data by a multiplexer in time-division, compares the analog data fetched with a reference value applied from a digital-to-analog converter by a two-input comparator, and produces the result of comparison to a data bus. The result of comparison is also applied to a successive approximation register where the analong-to-digital conversion is effected by successively changing the digital data to the digital-to-analog converter, and the digital data converted is read out onto the data bus.

The digital data applied to the digital-to-analog converter is either the output from the successive approximation register or the output from the reference register loaded through the data bus, in accordance with the contents of the control register loaded through the data bus. Thus, in which mode the device operates, in the comparing mode or in the analog-to-digital conversion mode, is selected by the control register.

4 Claims, 8 Drawing Figures

ANALOG DATA ACQUISITION DEVICE

CROSS-REFERENCE TO RELATED APPLICATION

This application is a continuation-in-part application of our copending application, Ser. No. 114,390 filed on Jan. 22, 1980 now abandoned.

BACKGROUND OF THE INVENTION

1. Field of the Invention

The present invention generally relates to analog data acquisition device for effecting an analog-to-digital conversion and a programmable voltage comparison. More particularly, the present invention relates to an analog data acquisition device which has a function to effect analog-to-digital conversion by a successive approximation system and another function to compare a voltage designated by a program with an input analog voltage to detect which one is larger (or smaller) in amplitude therebetween, these functions being easily changed over therebetween.

2. Description of the Prior Art

An approach in which a digital computer is used to effect analog-to-digital conversion by a successive approximation system and to compare an input analog signal with a reference value to detect which one is larger (or smaller) therebetween is disclosed in "ANALOG-TO-DIGITAL CONVERTER" by C. A. Walton, G. H. Royer and C. H. Proster, Jr., IBM Technical Disclosure Bulletin, Vol. 7, No. 10, March 1965. The approach executes analog-to-digital conversion by successively executing a successive approximation system program stored in a core storage and executes a program for a mere comparing operation to make comparison of an analog data with a reference voltage to detect which one is larger therebetween.

A digital computer may make various types of operations by changing programs stored in the core storage. Since the operation of the analog-to-digital converting operation per se is program control, however, the converting operation is slow. Further, when the digital computer per se executes the analog-to-digital conversion, it can not execute other processings. This deteriorates the cost/performance of the digital computer.

A high speed analog-to-digital converter using a successive approximation register for the successive approximation system analog-to-digital conversion is also known well. So far as we know, however, there is not an approach in which a voltage specified by a program is compared with an input analog voltage to detect which one is larger (or smaller) in amplitude therebetween and an analog-to-digital conversion is also performed, these two operation modes being switched or selected in an easy way.

SUMMARY OF THE INVENTION

A first object of the present invention is to provide an analog data acquisition device in which analog-to-digital conversion is performed at a high speed by using a successive approximation register, in which a voltage specified by a program and an input analog voltage are compared to judge which one is larger (or smaller) in amplitude, and in which these two operation modes are changed over in an easy way.

A second object of the present invention is to provide an analog data acquisition device which is operable at a high speed, and which has such a simple circuit configuration as to be easily designed to be realized in an LSI (large scale integrated) circuit.

A third object of the present invention is to provide an analog data acquisition system compatible with a microcomputer, in which decision is made in accordance with a command from the microcomputer as to which one is effected analog-to-digital converting operation or a comparing operation, and in which the convered digital data or the result of comparison is read into the microcomputer.

According to an aspect of the present invention, a switching means is provided to determine as to from which a digital data to be applied to a digital-to-analog converter be fetched, a successive approximation register or a reference data register which is set by a data bus. The switch means is controlled by a control register which may be loaded through the data bus.

According to another aspect of the present invention, there is provided a data register connected to an output terminal of a two-input comparator through a gate means which is on-off controlled by the contents of a control register. The output of the two-input comparator is stored in the data register under the condition that the output of a reference data register is connected to a digital-to-analog converter, and the stored data is read out through a data bus.

DETAILED DESCRIPTION OF THE PREFERRED EMBODIMENTS

Figure 1:
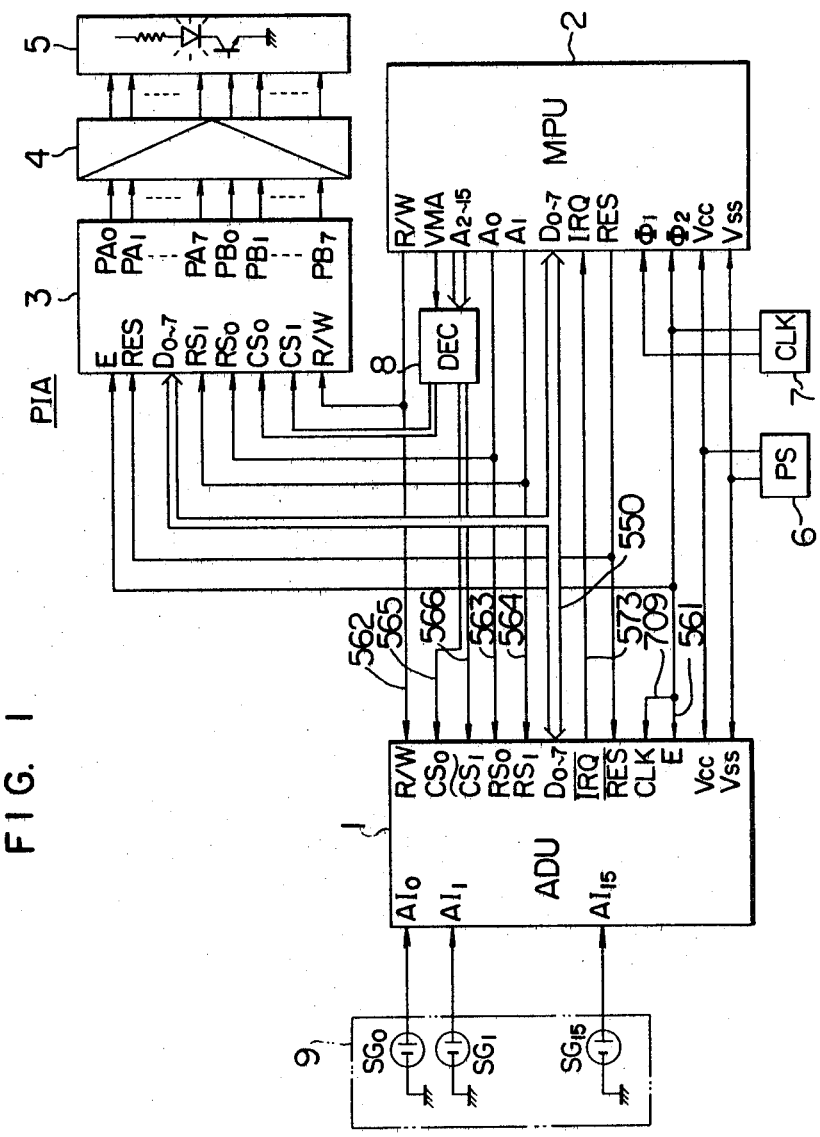
FIG. 1 is a block diagram illustrating an example of application of the present invention.

Referring to FIG. 1, an example of application of an analog data acquisition device according to the present invention will be described. In the figure, reference numeral 1 designates an analog data acquisition unit (hereinafter abbreviated as an ADU). For more details, reference is made to HD46508 Analog Data Acquisition Unit described in "'80 SEMICONDUCTOR DATA BOOK 8 BIT MICROCOMPUTER LSI" published by Hitachi Ltd.

A microcomputer unit (hereinafter abbreviated as MPU) 2 and a peripheral interface adaptor (hereinafter abbreviated as PIA) 3 are known well, and may be a HD46800D Micro Processing Unit and an HD46821 Peripheral Interface Adaptor, respectively, described in the above-mentioned Hitachi's publication. The detailed arrangements of the MPU 2 and PIA 3 are not essential to the present invention and hence will not be described.

The outputs $PA_0$–$PA_7$ and $PB_0$–$PB_7$ of the PIA 3 are connected to a display 5 through a buffer driver 4. A bidirectional data bus 550 is used for transferring data $D_0$–$D_7$ between the ADU 1 and the MPU 2. An enable signal E on a signal line 561, for which a clock signal produced by a clock generator (CLK) 7 is usually utilized, is used as a storobe signal for read/write operations of internal registers of the ADU 1.

Chip select signals $CS_0$ and $\overline{CS}_1$ on signal lines 565 and 566 respectively are input signals for addressing the ADU 1 through a decoder (DEC) 8 from the MPU 2. Only when the signal $CS_0$ is high in level and $\widetilde{CS}_1$ is low, the MPU 2 is allowed to make read/write operations to the internal registers of the ADU 1. A read/write signal R/W on a signal line 562 is an input signal for controlling the direction of data transfer between the MPU 2 and ADU 1. When the signal R/W is high, data of the ADU 1 is transferred to the MPU 2, and alternatively when the signal R/W is low, data is transferred from the MPU 2 to the ADU 1.

Register select signals $RS_0$ and $RS_1$ on respective signal lines 563 and 564 are input signals for selecting four registers in the ADU 1 and usually correspond to the lower two bits ($A_0$ and $A_1$) of the fifteen bits $A_0$–$A_{15}$ of the address signal from the MPU 2.

A reset signal $\overline{RES}$ is an input signal for resetting the ADU 1, and when the reset signal $\overline{RES}$ is low in level, the internal components of the ADU 1 operate as follos:

(1) The ADU 1 stops its operation and the internal registers are cleared.

(2) The output signals from the ADU 1 (except the signals $D_0$ to $D_7$) become all low.

The interrupt request signal IRQ on a signal line 573 is an output signal to inform the MPU 2 of the end of the A/D conversion.

$V_{cc}$ and $V_{ss}$ are power receiving high and low potential terminals across which electric power is supplied from a power source (PS) 6. The low potential terminal $V_{ss}$ is usually connected to an analog ground of the system.

The clock signal CLK supplied from the clock generator (CLK) 7 through a signal line 709 is a reference clock input signal for determining the internal timings for A/D conversion and programmable voltage comparison. $AI_0$ to $AI_{15}$ are analog input terminals to which analog data $SG_0$ to $SG_{15}$ are applied from a signal source 9. In the application example of FIG. 1, a given input signal voltage $SG_i$ is displayed in the display 5 when it is larger (or smaller) than a voltage set by the MPU 2.

Figure 2:
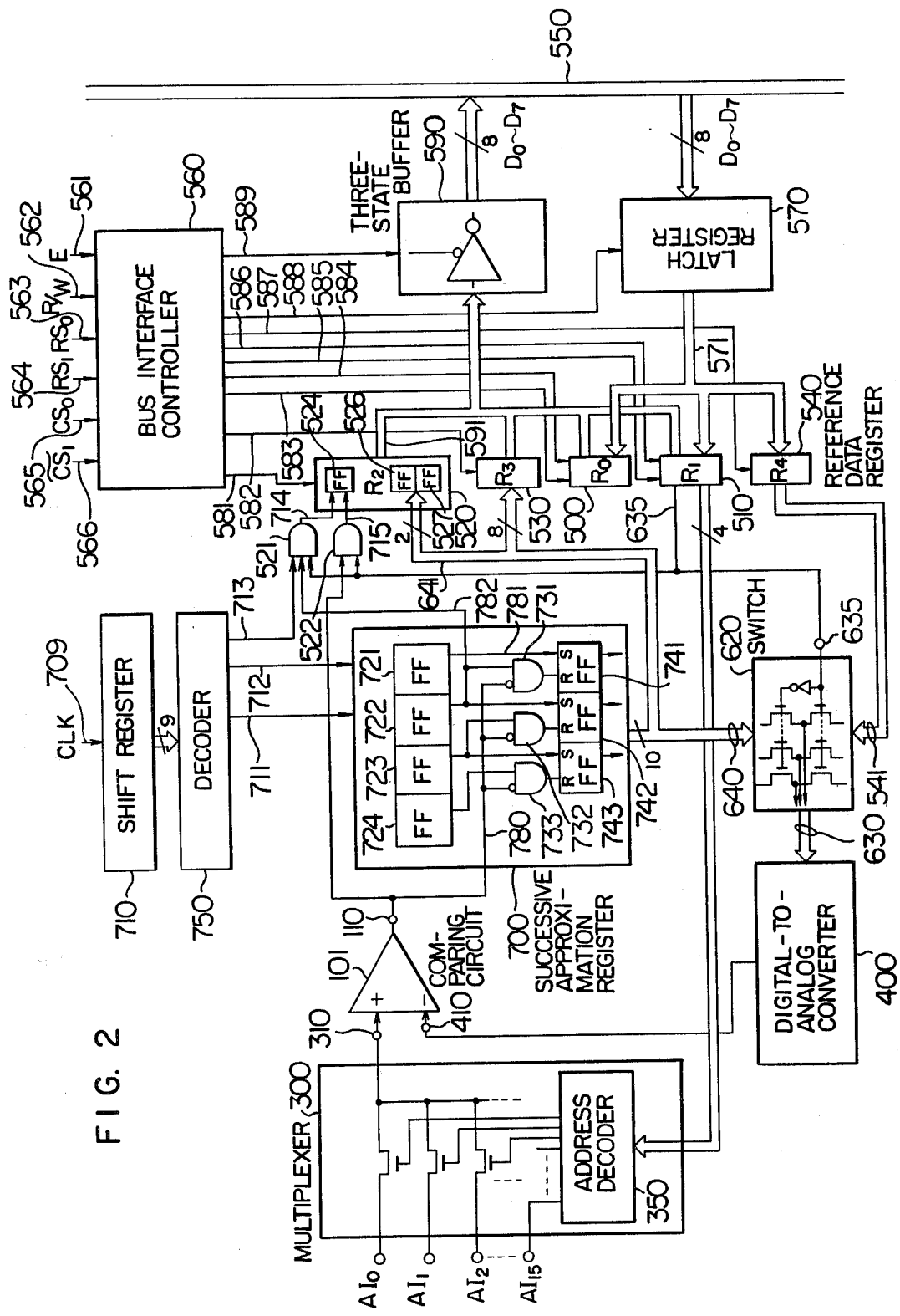
FIG. 2 is a circuit diagram of an embodiment of the present invention.

FIG. 2 shows an embodiment of the ADU 1 according to the present invention and particularly illustrates a concrete arrangement of a circuit mainly relating to its functions of a programmable voltage comparison and A/D conversion.

The respective circuits in blocks are arranged by a known circuit technique and an overall system containing those circuits are fabricated into a MOS LSI circuit which is compatible with a microprocessor.

A multiplexer 300 fetches one of analog data applied to analog input terminals $AI_0$ to $AI_{15}$ and produces an output signal at the (+) input terminal 310 of a comparing circuit 101. Which one of the analog input data be fetched is determined by an address decoder 350 as will be described later. The (−) input terminal 410 of the comparing circuit 101 is supplied with an analog voltage for comparison from a digital-to-analog converter (hereinafter abbreviated as D/A) 400. The output terminal 110 of the comparing circuit 101 is connected to a bit judging signal line 780 of a successive approximation register (hereinafter abbreviated as SAR) 700, and also to a data register $R_2$ 520 through an AND gate 522. The data register $R_2$ 520 comprises flip-flops 524, 526 and 527, and the output 715 of the gate 522 is connected to a data input terminal of the flip-flop 524. The output 714 of an AND gate 521 is connected to a latch control input terminal of the flip-flop 524.

The AND gate 521 is connected, at its three input terminals, to an output line 782 led from the SAR 700, an output line 713 of a decoder 750, and an output line 635 of a control register $R_1$ 510. The control register $R_1$ 510 is connected to a bidirectional data bus 550 through a latch register 570. Four bits of the control register $R_1$ 510 are coupled with the address decoder 350 of the multiplexer 300. The MPU 2 (not shown in FIG. 2) may change the contents of the register $R_1$ 510 to select any one of the analog input terminals $AI_0$ to $AI_{15}$. A digital output 630 of a switch 620 is applied to a digital input of the D/A 400.

The switch 620 has an input terminal to which digital data 640 from the SAR 700 is applied, another input terminal to which digital data 541 from a reference data register $R_4$ 540 to be described later is applied, and a control terminal to which a control signal 635 is applied from the register $R_1$ 510. The register $R_4$ 540 is coupled with the bidirectional data bus 550 through the latch register 570, so that the MPU 2 may set desired digital data into the register 540. The switch 620 allows the digital data 541 from the register $R_4$ 540 to be transferred to the output terminal 630 when the control signal 635 is high in level, while it allows the digital data 640 from the SAR 700 to be transferred to the output terminal 630 when the control signal 635 is low. As will be described later, when the control signal 635 is high, the ADU operates in a programmable voltage comparing mode, while when the control signal 635 is low, it operates in an A/D conversion mode.

The SAR 700 (in the drawing, only three bits of the SAR is illustrated for simplicity), is a logic register for effecting the A/D conversion, and is comprised of a sequencer section for sequentially setting flip-flops 721 to 724 in the SAR 700 in response to clock CLK and sequence start signals respectively received on its input lines 711 and 712 from the decoder 750, flip-flops 741 to 743 for controlling the bit weight of the output data from the SAR 700, and inhibit gates 731 to 733 for resetting the flip-flop 741 to 743 by using the comparator output on the signal line 780 and the outputs from the flip-flops 721 to 724.

Figure 3:
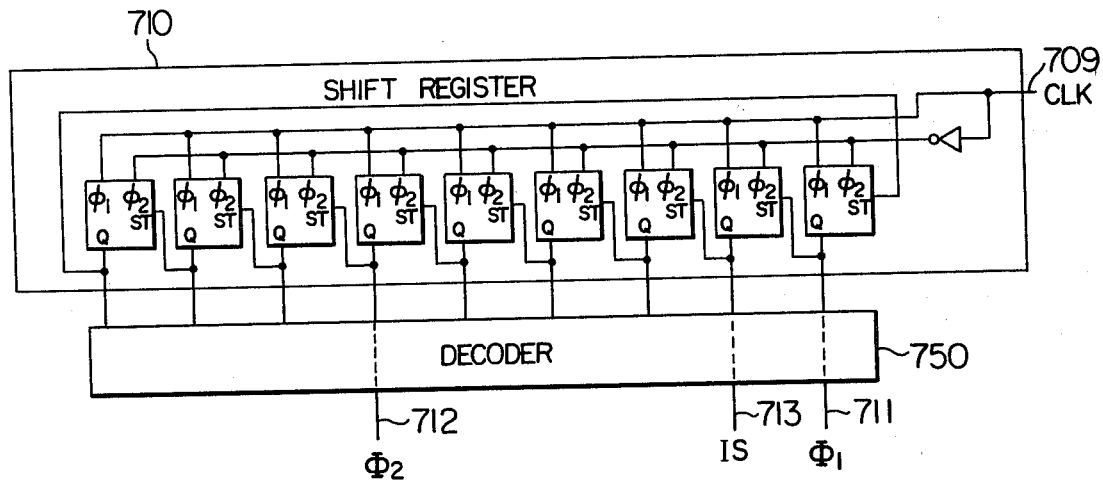
FIGS. 3 to 5 are circuit diagrams illustrating respective portions of the circuit shown in FIG. 2.

FIG. 3 shows a particular arrangement of the decoder 750 and a shift register 710 of FIG. 2. The decoder 750 is a gate circuit for producing signals to control the operation of the overall ADU. In this example, illustrated are only clock signals $\phi_1$ 711 and $\Phi_2$ 712 which are produced in response to the output signals from the shift register 710 to drive the sequencer flip-flops 721 to 724 of the SAR 700 and a signal IS 713 to provide timing to latch the output of the comparing circuit 101 in the flip-flop 524. The shift register 710 is a kind of a ring counter comprised of a chain of master-/slave type flip-flops which are responsive to the clock signal CLK on a clock input line 709 to successively shift the signal inputted, with the last stage of the flip-flop chain connected to the first stage.

Figure 4:
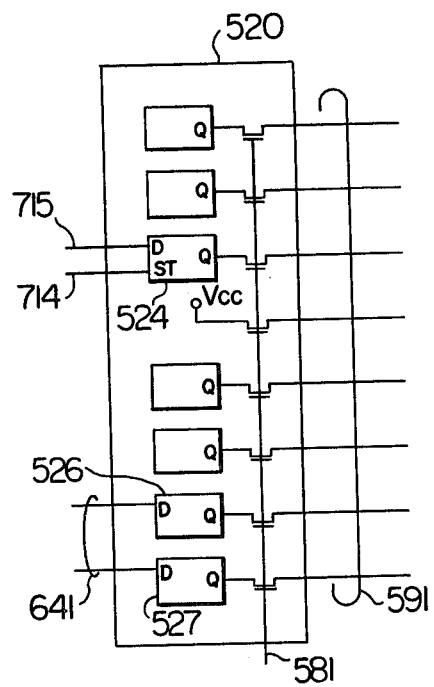

The registers $R_0$ 500, $R_1$ 510 and $R_4$ 540 are accessible to be loaded by the microprocessor through the data bus 550, the latch register 570, and an internal data bus 571. Control data are loaded into the registers $R_0$ 500 and $R_1$ 510. As described above, the address data for the multiplexer 300 and the one bit control signal 635 to switch the operation mode between the A/D conversion and the programmable voltage comparison are set in the register $R_1$ 510. Registers $R_2$ 520 and $R_3$ 530, which are accessible to read out the contents stored therein, are used for storing the output data to be transmitted to the MPU 2. Of ten-bit output lines of the SAR 700, the upper two-bit lines designated by 641 are connected to the register $R_2$ 520, and the lower eight-bit lines to the register $R_3$ 530. FIG. 4 illustrates a specific arrangement of the register $R_2$ 520. A plurality of flip-flops which change their states in accordance with the operation state of the ADU are contained in the register $R_2$ 520, in addition to the three flip-flops 524, 526 and 527 which are illustrated in FIG. 2. The flip-flop 524 is provided for storing the data of the comparison result, as mentioned above.

A three-state buffer 590 of FIG. 2 is a known circuit for transmitting data in the registers $R_0$ 500, $R_1$ 510, $R_2$ 520 and $R_3$ 530 in the chip to the data bus 550 through an internal data bus 791, and is controlled by read timing signals applied through an output line 589 of a bus interface control circuit 560.

The latch register 570 is connected at its input to the data bus 550 and at its output to the accessible registers $R_0$ 500, $R_1$ 510 and $R_4$ 540 in the chip by way of the signal line 571, and receives a latch timing signal through an output line 588 of the bus interface control circuit 560.

Figure 5:
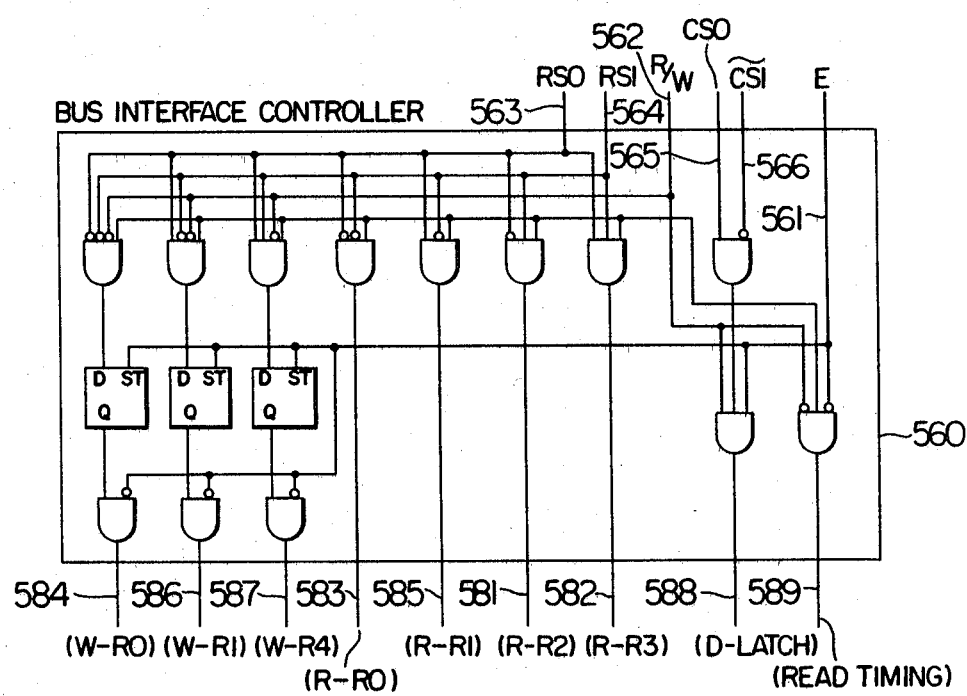

FIG. 5 shows a specific arrangement of the bus interface control circuit 560. The control circuit 560 is provided with an enable input line 561, a read/write input line 562, register select 12 input lines 563 and 564, and chip select input lines 565 and 566. The control circuit 560 has signal output lines 584, 586 and 587 for providing write timing signals W-$R_0$, W-$R_1$ and W-$R_4$ to the respective registers $R_0$ 500, $R_1$ 510 and $R_4$ 540 when data are written thereinto by the MPU 2. The control circuit 560 is further provided with signal output lines 581 to 583 and 585 for providing select signal R-$R_0$, R-$R_1$, R-$R_2$, R-$R_3$ for the respective registers $R_0$ 500, $R_1$ 510, $R_2$ 520 and $R_3$ 530 when the contents of these registers be read out by the microprocessor. Additionally, the circuit 560 has the signal output lines 588 and 589 for providing control signals D-LATCH and READ TIMING for the latch register 510 and the three-state buffer 590 respectively, as described above. In the bus interface control circuit 560, the selection of the five registers $R_0$ to $R_4$ is effected by using a read/write signal R/W on the like 562 in addition to the two-bit register select signals $RS_0$ and $RS_1$ on the lines 563 and 564 respectively. The control input lines 561 to 566 and the data bus 550 are arranged on the same signal definition as that of the known standard 8-bit microprocessor, so as to be directly coupled with a microprocessor.

Figure 6:
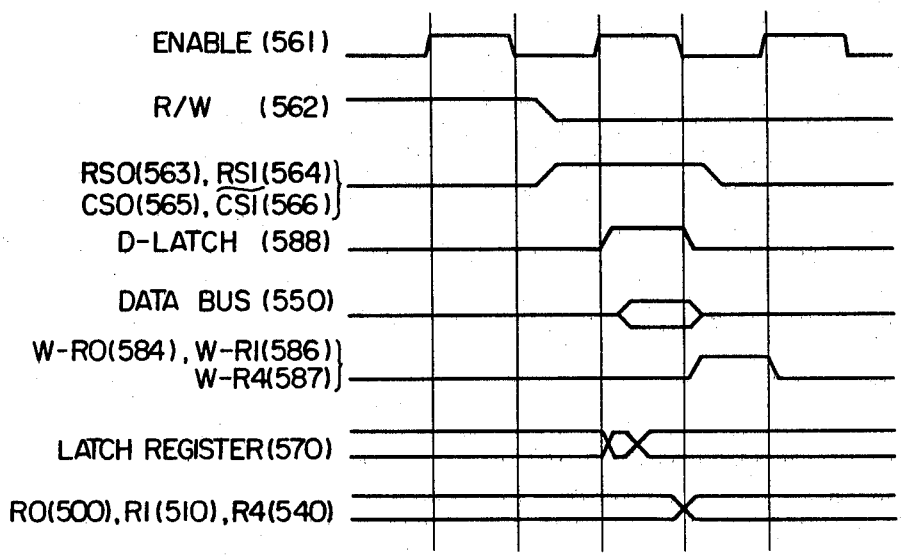
FIGS. 6 to 8 illustrate timing charts useful in explaining the operation of the present invention.
Figure 7:
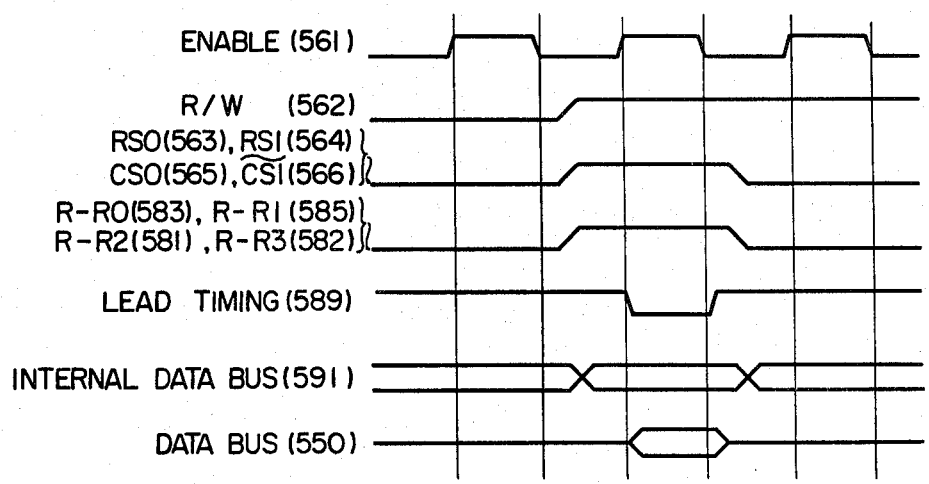

FIGS. 6 and 7 respectively show timing charts when data are written-into and read-out of the registers in the chip by the microprocessor MPU 2.

The operation of the thus arranged embodiment shown in FIG. 2 will be described.

In the case where the analog data acquesition device operates in a comparison mode the MPU 2 is set in a write mode and necessary data are loaded into the registers $R_0$ 500, $R_1$ 510 and $R_4$ 540 through control input lines 561 to 566 and the data bus 550. More specifically, the control data is written into the control register $R_0$ 500; the select address of the input multiplexer 300 and the data for rendering the output on the line 635 "1" are written into the control register $R_1$ 510; and the data code for setting the output voltage of the D/A converter 400 is written into the data register $R_4$ 540.

The output on the line 635 of the control register $R_1$ 510 enables the AND gate 522 to transfer the output 110 of the comparator 101 to the flip-flop 524 of the data register $R_2$ 520 and also change over the state of the switch 620 so as to receive the data on the signal line 541.

Figure 8:
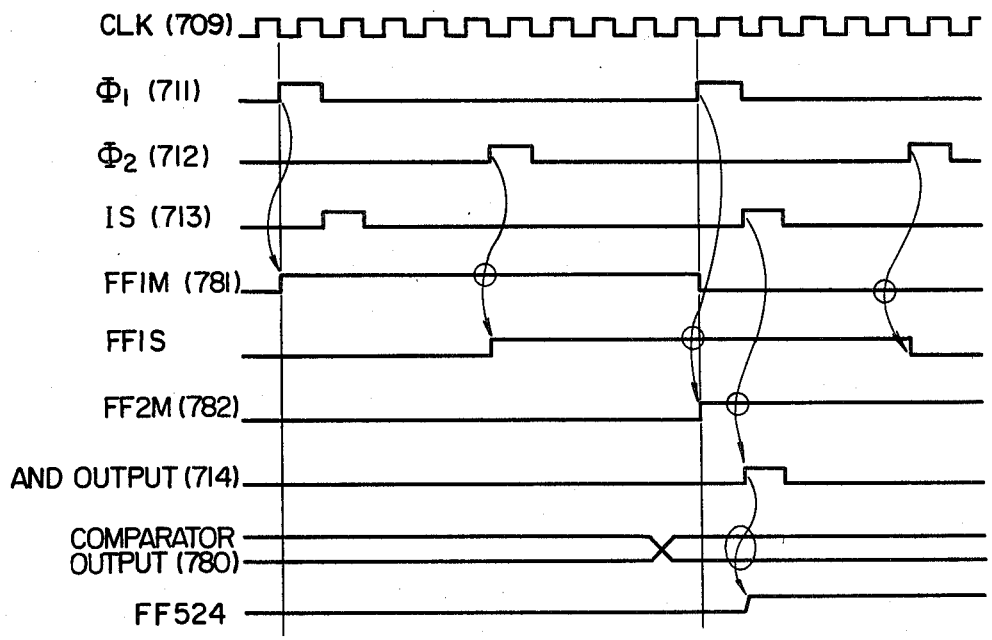

Under this condition, the data representing the contents of the data register $R_4$ 540 is received in the D/A converter 400 which in turn produces a voltage corresponding to the received data. The voltage the thus produced is applied as a threshold voltage to the (—) input terminal 410 of the comparator 101. The comparator 101 compares the threshold voltage with a signal voltage applied to its (+) input terminal through the multiplexer 300 to detect which one is larger therebetween. Then, the result of comparison is applied to the flip-flop 524 of the data register $R_2$ 520 through the AND gate 522 under the control by the signal FF2M on the output line 782 of the shift register flip-flop 722, the signal IS on the output line 713 of the decoder 750 and the control signal on the line 635 from the register $R_1$ 510. FIG. 8 shows a timing chart illustrating the operation of the device in the comparator mode. The clock signal CLK on the line 709 drives the shift register 710. The signals $\phi_1$ 711, $\phi_2$ 712 and IS 713 are produced from the decoder 750 as described above. The signals $\phi_1$ 711 and $\phi_2$ 712 are used to drive the master/slave flip-flops 721 to 724 of the SAR 700. Each of the flip-flops 721 and 722 is a kind of master/slave flip-flops. The waveforms FF1M (781), FF1S, and FF2M (782) illustrate the respective states of the master flip-flop section of the flip-flop 721, the slave flip-flop section of the flip-flop 721 and the master flip-flop section of the flip-flop 722. The comparing operation of the comparator 101 is performed within a period where the FF1M (781) is "1" and the result of comparison is established as seen in the waveform "COMPARATOR OUTPUT (780)". The result is latched in the flip-flop 524 through the AND gate 522 under the control by the output 714 of the AND gate 521 obtained by ANDing the signals FF2M (782), IS(713) and the control signal (635).

Then, the MPU 2 is set in a read mode so that the contents of the data register $R_2$ 520 are read out through internal data bus 591, the three state buffer 590 and the data bus 550, thereby obtaining the result of comparison. In this way, the MPU 2 can quickly detect which one is larger (or smaller) in amplitude, the input signal voltage or the threshold value.

The case where the analog data acquisition device operates in the A/D conversion mode will be described. The MPU 2 is set in a write mode to write necessary designation signals into the respective registers through the control input lines 561 to 566, and the data bus 550. These designation signals are substantially the same as those in the comparator mode except that the one bit control signal 635 of the control register $R_1$ 510 is rendered "0".

Upon completion of the writing operation into the control register $R_1$ 510, the input signal from the comparator 101 to the flip-flop 524 is blocked by the AND gate 522, and at the same time the state of an switch 620 is changed over to receive the input signal on the line 640. When the data writing to the control register $R_1$ 510 is completed, the shift register 710 is actuated to apply the drive pulses $\phi_1$ and $\phi_2$ to the SAR 700 through the respective output signal lines 711 and 712 of the decoder 750 to effect the known successive approximation A/D conversion. Specifically, the SAR 700 renders "1" only the flip-flop 741, which corresponds to the MSB of ten bits the SAR 700, to cause the D/A converter 400 to produce a voltage having a half of the full scale amplitude. This voltage is applied to the (−) input 410 of the comparator. Thus the result representing the MSB is set up through the gate 731 on the basis of the output signal on the line 780 indicating the comparison result of the comparator. This converting operation is successively repeated bit by bit until the LSB is reached. The converted data is set in the data registers $R_2$ 520 and $R_3$ 530. The MPU 2 reads out the contents of the data registers $R_2$ 520 and $R_3$ 530 through the internal data bus 591, the three-state buffer 590 and the data bus 550.

In the embodiment of FIG. 2 according to the present invention, the switch 620 is provided on the input side of the D/A converter 400, and the gate 522 is provided at the input side of the flip-flop 524, and the control signal for the switch 620 and the gate 522 is loaded into one control bit in the control register $R_1$ 510 by the MPU 2, whereby the voltage comparison as well as the A/D conversion may selectively be performed in an easy way. Accordingly, in practical use, in a situation requiring mere voltage comparison, the analog data acquisition device is operated in a comparator mode and only in a situation requiring the time-consumed A/D conversion, the device is operated in an A/D conversion mode, with the result that the signal processing speed is remarkably reduced.

We claim:

1. An analog data acquisition device comprising:
   a multiplexer for fetching a plurality of data in time-division;
   a two-input comparator for comparing a signal successively applied from said multiplexer to one input thereof with a reference value applied to the other input thereof;
   a data bus;
   means for transferring a result of comparison of said two-input comparator to said data bus;
   a successive approximation register for receiving the result of comparison from said two-input comparator;
   a reference data register connected to said bus;
   a control register connected to said bus;
   switch means having a first and a second digital data input, a digital data output, and a control input, said first digital data input being connected to the output of said successive approximation register, said second digital data input being connected to the output of said reference data register, said control input being connected to the output of said control register, said switch means being responsive to the contents of said control register to select one of two input data applied to said first and second digital data inputs and produce the selected one from said digital data output; and
   a digital-to-analog converter connected to said digital data output of said switch means for converting the digital data produced therefrom into analog data and for producing the analog data as said reference value.

2. An analog data acquisition device according to claim 1, further comprising:
   an AND gate having two inputs one of which is connected to said control register so that said AND gate is subject to on-off control according to the contents of an output of said control register and the other of which is supplied with the result of the comparison which is produced from said AND gate when said AND gate is at its on-state;
   a first data register for storing the result of comparison produced from said AND gate;
   a second data register for storing digital data produced from said successive approximation register;
   a three-state buffer connected between each of said first and second data registers and said data bus, said buffer exhibiting a low impedance only when the output data from said first and second data registers are read out onto said data bus; and
   a bus interface controller for receiving control signals including a strobe signal, a read/write signal to control the direction of the data transfer, and a register select signal and for controlling said latch register, said reference data register, said control register, said first data register, said second data register and said three-state buffer.

3. An analog data acquisition device having a function to fetch in a time-division manner a plurality of analog data by a multiplexer, to compare the analog data with a reference value applied from a digital-to-analog converter by a two-input comparator, and to produce the result of comparison to a bidirectional data bus, and another function to analog-to-digital convert said input analog data by successively changing the digital data applied in succession from a successive approximation register to said digital-to-analog converter in accordance with the result of comparison, and to produce the result of comparison onto said bidirectional data bus, said device comprising:
   gate means connected to the output of said two-input comparator;
   a first data register connected to said gate means for storing said result of comparison;
   a second data register connected to the output of said successive approximation register for storing the digital data produced therefrom;
   a three-state buffer connected between each of said first and second data registers and said bidirectional data bus, said buffer exhibiting a low impedance only when the contents of said first and second data registers are read out onto said bidirectional data bus;
   a latch register connected to said bidirectional data bus;
   a reference data register connected to said latch register;
   a control register connected to said latch register;
   switch means having first and second digital data inputs, a digital data output, and a control input, said first and second digital inputs being connected to the respective outputs of said successive approximation register and said reference data register, said digital data output being connected to the input of said digital-to-analog converter, said control input being connected to the output of said control register, said switch means being responsive to the contents of said control register to select one of two input data applied to said two digital data inputs and produce the selected one from said digital data output; and
   a bus interface controller for receiving control signals including a strobe signal, a read/write signal to control the direction of the data transfer, and a register select signal and for controlling said latch register, said reference data register, said control register, said first data register, said second data register and said three-state buffer.

4. An analog data acquisition device according to claim 1 or 2, wherein each of said reference data register and said control register is connected to said bus through a latch register.

* * * * *